United States Patent [19]
Uber

[11] Patent Number: 5,939,926
[45] Date of Patent: Aug. 17, 1999

[54] INTEGRATED CIRCUIT OUTPUT DRIVER FOR DIFFERENTIAL TRANSMISSION LINES

[75] Inventor: Richard Uber, North Grafton, Mass.

[73] Assignee: Quantum Corporation, Milpitas, Calif.

[21] Appl. No.: 09/023,442

[22] Filed: Feb. 13, 1998

[51] Int. Cl.⁶ .............................. H03K 17/16; H03K 3/00
[52] U.S. Cl. ........................ 327/382; 327/112; 327/391; 327/437; 326/21; 326/86
[58] Field of Search .................... 327/108, 112, 327/382, 387, 389, 379, 111, 391, 170, 437; 326/17, 83, 86, 121, 21

[56] References Cited

U.S. PATENT DOCUMENTS

| | | | |
|---|---|---|---|
| 4,329,600 | 5/1982 | Stewart | 361/89 |
| 5,329,186 | 7/1994 | Hush et al. | 326/88 |
| 5,381,062 | 1/1995 | Morris | 326/68 |
| 5,623,221 | 4/1997 | Miyake | 327/108 |
| 5,831,458 | 11/1998 | Nakagawa | 327/108 |
| 5,834,948 | 11/1998 | Yoshizaki et al. | 326/81 |

*Primary Examiner*—Kenneth B. Wells
*Assistant Examiner*—Hai L. Nguyen
*Attorney, Agent, or Firm*—David B. Harrison

[57] ABSTRACT

An integrated circuit driver chip includes an on-board precision current reference source, a pull-up FET and a pull-down FET having a common node connected to a transmission line. A variable switching edge pre-driver drives at least one of the pull-up FET and pull-down FET in accordance with a push-pull fast edge mode and a wired-OR slow edge mode and includes a weak FET and a strong FET selectively connected in parallel with the weak FET to implement the push-pull fast edge mode while the weak FET operating alone implements the wired-OR slow edge mode. A switched current source selectively sources current through the pull-up FET to the transmission line in accordance with the data signal and includes a trickle current FET switch for maintaining charge stored on a parasitic capacitance when the pull-up FET is off thereby preventing current spikes during turn-on switching of the pull-up FET.

9 Claims, 3 Drawing Sheets

A

B

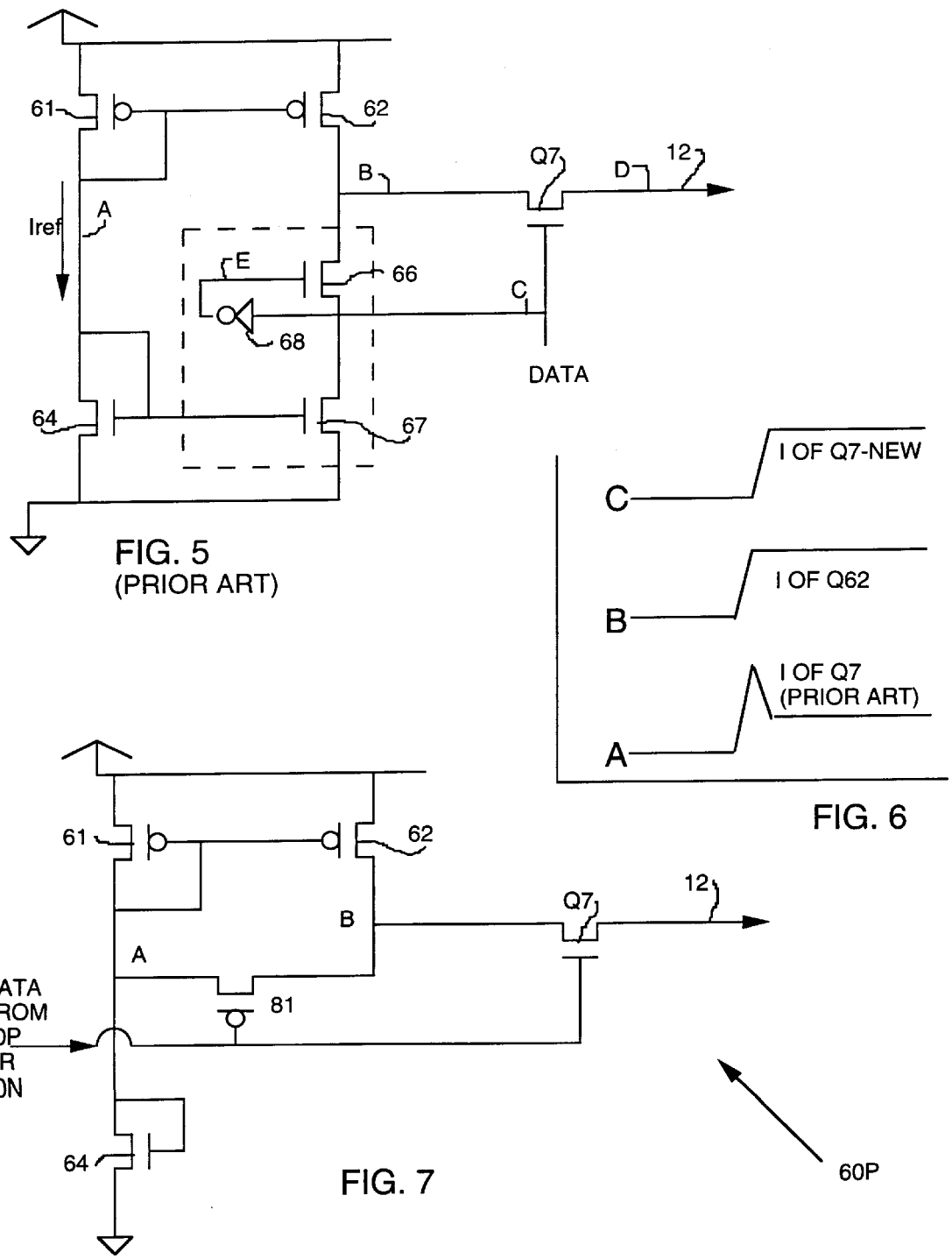

INTEGRATED CIRCUIT OUTPUT DRIVER FOR DIFFERENTIAL TRANSMISSION LINES

FIELD OF THE INVENTION

The present invention relates to the field of digital data transmission lines and related driver circuits. More particularly, the present invention is related to improvements in integrated circuit output driver for driving digital differential signal transmission lines.

BACKGROUND OF THE INVENTION

Buses are used to interconnect components and elements of digital computing systems. A bus is a collection of wires in a cable or conductive traces on a printed circuit board which transmit data, status, and control signals, and to supply operating power and ground return paths. A bus between physically separate computing systems is frequently referred to as a network.

Standard buses and bus structures have become widespread in digital computing. One family of bus structures is known as Small Computer System Interface, or "SCSI". The SCSI bus structure has become standardized, as specified by document S3.131-1986 published by the American National Standards Institute in June, 1986. This bus enabled eight computer CPUs and peripherals to be interconnected, and provided a defined physical interconnect and a signaling construct enabling exchange of data between interconnecting computing/storage subsystems, etc.

One recent improvement to SCSI has been the low voltage differential (LVD) bus structure. In differential mode information is sent simultaneously through a pair of wires. The information is interpreted as the difference in voltage between the two wires. External noise affects the signal on the wires equally and the difference in noise voltage is zero. The wires are frequently twisted together which provides desired noise cancellation. Accordingly, the LVD bus may extend over a greater distance than a single-ended bus. A first logical condition (such as "true") is present when the voltage on one wire exceeds the voltage on the other wire of the LVD bus pair. When the voltages are reversed, a second logical condition (such as "false") is present. The LVD bus pair has a specified differential signaling range of approximately 400 millivolts, e.g. 1.1 volts to 1.5 volts. That is to say, voltages on the pair of wires of 1.5 volts/1.1 volts would be interpreted as a logical high or true level whereas voltages on the same pair of wires of 1.1 volts/1.5 volts would be interpreted as a logical low or false level. The specified signaling range is 0.5 volts to 2.0 volts, with a 400 millivolts differential. Thus, voltage differences of 0.9 volts/0.5 volts, and 1.9 volts/1.4 volts would result in a logical high level, and if reversed, a logical low level, on the LVD bus pair.

FIG. 1 shows a conventional digital differential bus structure 10 which implements a bus standard or convention, such as LVD SCSI, for example. The bus 10 includes a positive line 12 and a negative line 14. When the positive line 12 is driven high or true (and the negative line 14 is driven low or false) a digital value is being asserted (true). On the other hand, when the positive line 12 is driven low or false (and the negative line 14 is driven high or true), the digital signaling condition is negated (false). The bus 10 is terminated at each end by a terminator 16 which matches the characteristic differential impedance of the bus. A bias generator 18 applies a weak negation bias to the differential bus 10, such as e.g. −2.1 milliamperes which forces the bus 10 to a known logical state (negation) during bus idle mode, for example. The positive line 12 is driven negative with respect to the negative line 14 by the weak negation bias.

A number of users (drops) may be connected to the bus 10. Four users 1, 2, 3 and 4 are shown connected to bus 10 in FIG. 1, although a greater number or lesser number of users may be attached (the minimum number of users being two). In the LVD SCSI specification up to 16 users may be connected. The four users shown in FIG. 1 include output integrated circuit (IC) drivers 20, 22, 24 and 26. Each one of the drivers 20, 22, 24 and 26 is typically part of a very large scale integrated circuit (VLSI) bus interface chip, and is therefore subject to voltage, temperature and manufacturing tolerances, which have proven to be problematic, particularly with the relatively low signaling bandwidth of LVD SCSI. (Those skilled in the art will appreciate that FIG. 1 omits data receivers which are connected to receive data from the bus 10, as the present invention relates to improvements in IC drivers; in practice, receivers would be present in each user interface circuit chip).

The specification for LVD SCSI calls for operation in two disparate modes, a "push-pull" mode and a "wired-OR" mode. In push-pull mode the driver is required to force both directions of logical change of bus state with comparable signal amplitudes. In wired-OR mode only one direction of logical change is driven by the IC driver, and the other transition is forced by the weak bias generator 18 which returns the bus to its default (idle) state. Push-pull is used for high speed data transfers, while wired-OR is used for low speed transfers. One problem lies in providing a single IC driver circuit which provides optimal wave shapes in both push-pull and wired-OR operational modes. The prior approach has been to compromise with non-optimal wave forms for each transition. This compromise is made at the time the IC chip is designed and built, and cannot be altered later. Therefore, a hitherto unsolved need has arisen for a method and apparatus for generating multiple variable edge rates for the driver.

An asymmetrical current mode driver is used for high speed synchronous data transfers over a transmission path such as LVD SCSI. For signal assertion (logical true condition) a differential current of about nine milliamperes is driven, and for active negation, a current of about minus four and one half milliamperes is driven. This difference in driving current between assertion and negation is necessary to counteract the weak negation bias applied to the bus 10 by the negation bias generator 18. The act of turning on and off half of the driver causes undesirable transients because of parasitic capacitance associated with the current source. These capacitances store charge which comes into play when the current source is connected to, and disconnected from, the bus. The signal transmitted to the bus may have a leading edge overshoot as great as fifty percent above the nominal signal amplitude. One prior approach for solving this problem was to substitute a dummy load for the transmission line during times in which the signal is not being driven onto the line. However, this prior approach adds complexity and results in consumption of considerably more power than desirable, leading to IC chip heating and thermal tolerance variations, as well as additional power supply requirements. Therefore, a hitherto further unsolved need has remained for an IC driver chip which provides for smooth ramping of a current source which is switched onto a transmission line.

SUMMARY OF THE INVENTION

A general object of the present invention is to provide an improved integrated circuit driver chip which provides precision variable transition edge rates and switched current sourcing without current spikes in a manner overcoming limitations and drawbacks of prior approaches.

Another object of the present invention is to implement a number of features and improvements within an integrated circuit driver chip for driving a transmission bus, such as a differential low voltage bus. These features and aspects of the invention work together to implement selectable fast and slow edge operating modes, and to remove switching transients otherwise attributable to parasitic capacitance in a manner overcoming limitations and drawbacks of the prior art.

In one aspect of the present invention an integrated circuit driver chip is provided to drive a data signal onto a transmission line carrying a weak logic bias for biasing the line to a known state during line-idle conditions. The chip includes a variable switching edge pre-driver connected to drive at least one of a pull-up FET and a pull-down FET having a common node connected to the transmission line in accordance with a push-pull fast edge mode and a wired-OR slow edge mode. The variable switching edge driver includes two current source FETs, a strong FET being selectively connected in parallel with a weak FET in accordance with a mode control signal such that the strong FET switched to be in parallel with the weak FET implements the push-pull fast edge mode, while the weak FET alone implements the wired-OR slow edge mode. The chip also includes a switched current source for selectively sourcing current through the pull-up FET to the transmission line in accordance with the data signal and includes a trickle current switched bypass FET switch for bypassing parasitic capacitance when the pull-up FET is off, thereby preventing current spikes during turn-on switching of the pull-up FET.

These and other objects, aspects, advantages and features of the present invention will become more completely understood and appreciated by considering the following detailed description of a preferred embodiment which is presented in conjunction with the accompanying drawings.

BRIEF DESCRIPTION OF THE DRAWINGS

In the Drawings:

FIG. 5 is a block and schematic diagram of a switched current source known in the prior art.

FIG. 6 is a pair of waveform graphs illustrating operational drawbacks including surge current of the FIG. 5 circuit during off-on switching.

FIG. 7 is a block and schematic diagram of an improved switched current source included within the FIG. 2 IC driver chip overcoming drawbacks of the FIGS. 5 and 6 approaches in accordance with principles of the present invention

DETAILED DESCRIPTION OF A PREFERRED EMBODIMENT

Figure 2:
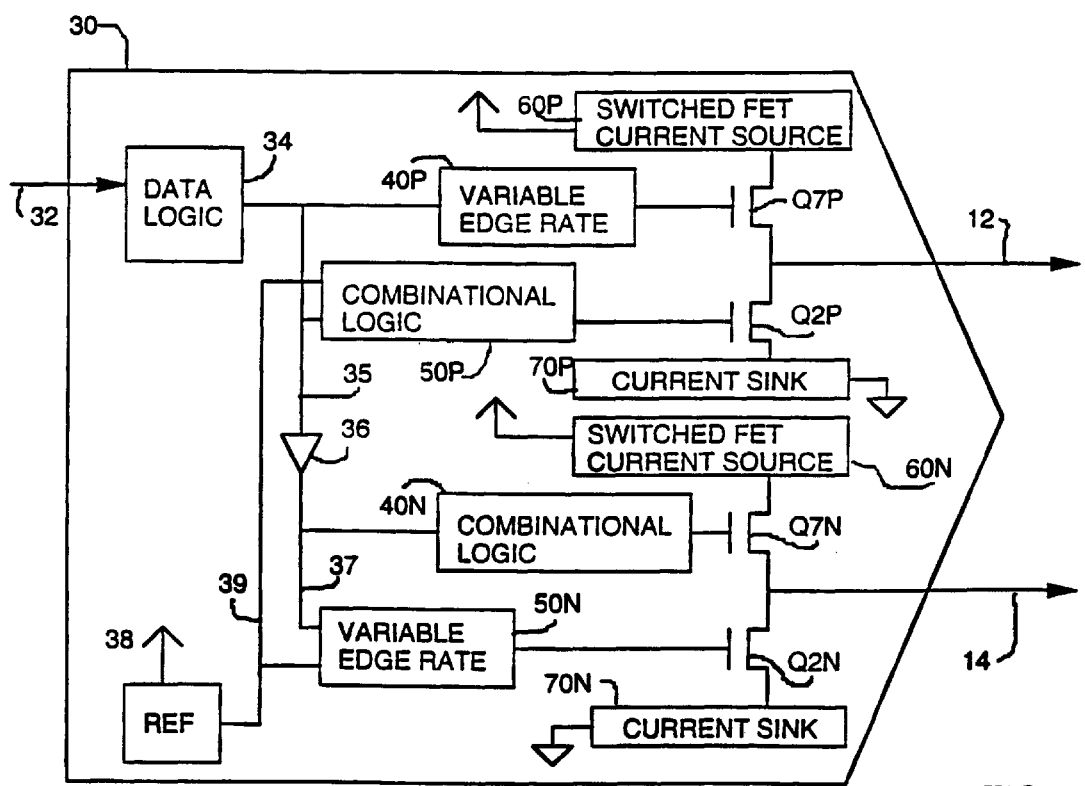
FIG. 2 is a block diagram of an IC driver chip in accordance with principles of the present invention for driving the FIG. 1 bus.

In accordance with principles of the present invention an improved IC driver chip 30 is shown in pertinent overview in FIG. 2. While the chip 30 includes additional circuitry, that circuitry is not pertinent to an understanding of the present invention, is known to those skilled in the art, and has been omitted from FIG. 2 to save drawing room and unneeded clutter in the illustration.

Figure 1:
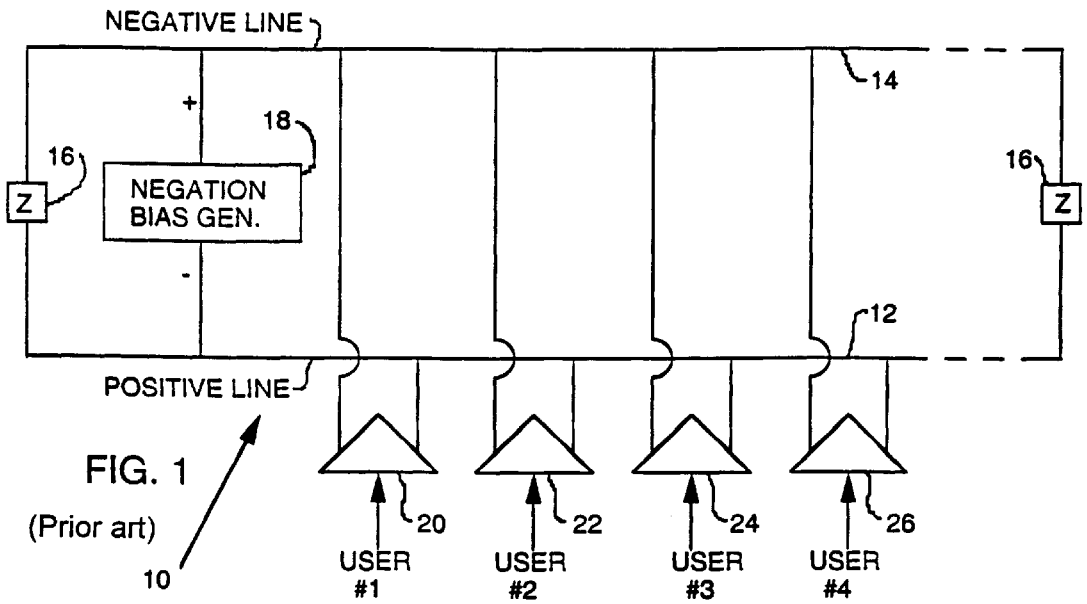
FIG. 1 is a block diagram of a conventional multi-user differential communication bus having and supporting multiple (e.g. four) users and having bus terminations and a weak bias generator for biasing the bus during idle to a known logical state (e.g. negation).

The IC chip 30 may be used in lieu of chips 20, 22, 24 and 26, and it may be used in addition to those driver circuits on the FIG. 1 LVD SCSI bus 10. The driver 30 includes driver circuits for driving positive line 12 and negative line 14. These circuits are substantially symmetrical at the architectural level, it being important to remember that the logic level assertion circuits differ from the logic level negation circuits in order to compensate for the weak negation bias present on the lines 12 and 14.

The IC chip 30 includes a data input line for receiving digital data to be sent over the network 10. An internal digital data logic circuit 34 distributes the data over a bus 35 directly to circuitry associated with the positive differential data line 12. An inverter 36 inverts the data on the line 35 and puts out inverted data on a line 37 to circuitry associated with the negative differential data line 14.

Each data line includes a pull-down driver FET transistor Q2 and a pull-up driver FET transistor Q7. Thus, the positive line 12 connects to a common node of transistors Q2P and Q7P, and the negative line 14 connects to a common node of transistors Q2N and Q7N.

Figure 3:
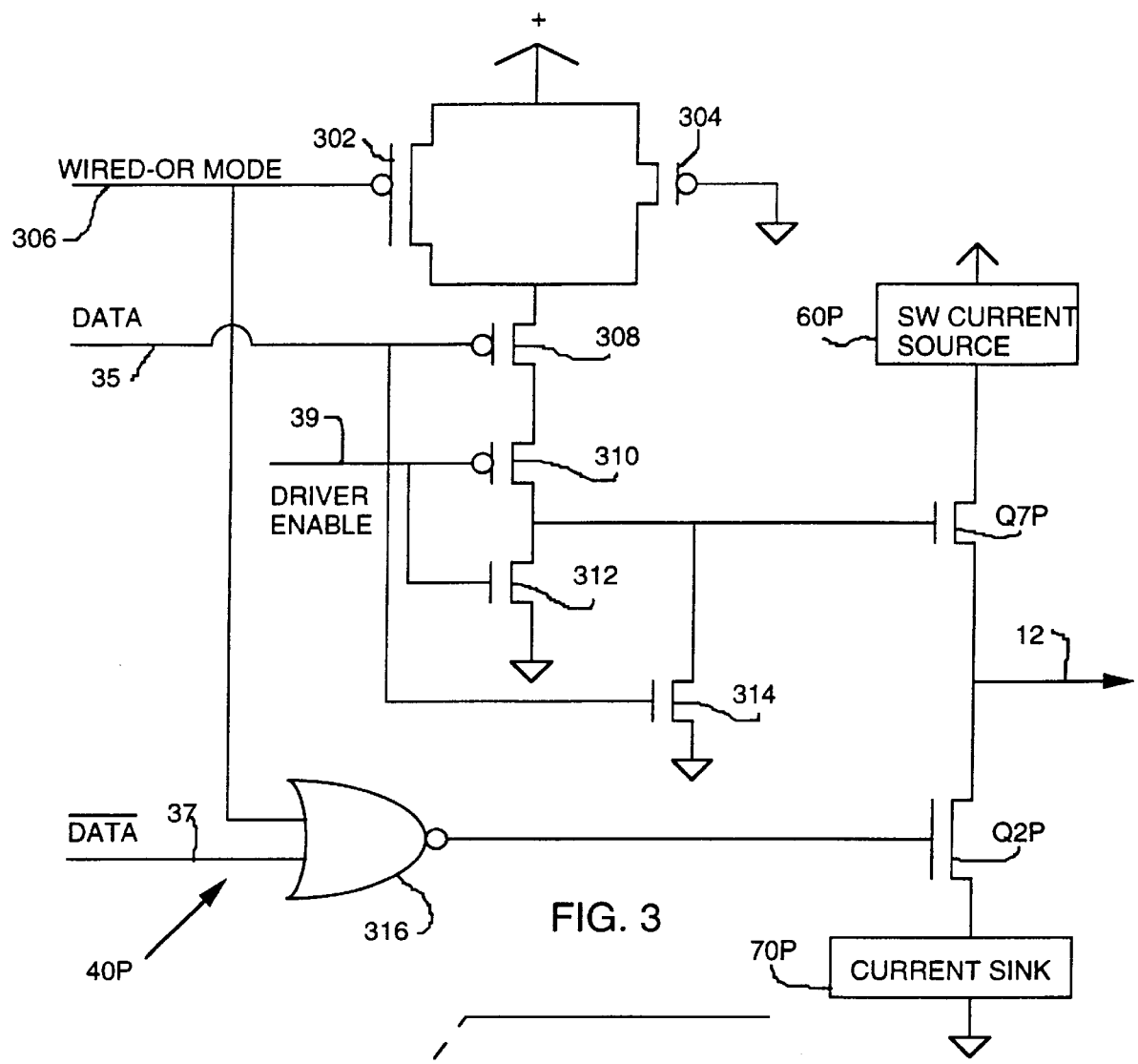
FIG. 3 is a block and schematic circuit diagram of a variable edge rate driver circuit included within the FIG. 2 IC driver chip for dual mode driving of the FIG. 1 bus in accordance with principles of the present invention.
Figure 4:
FIG. 4 is a pair of waveform graphs illustrating operation of the FIG. 3 variable rate driver circuit. Graph A shows wired-OR mode of operation. Graph B shows push-pull mode having fast edges during switching in both directions.
Figure 4:
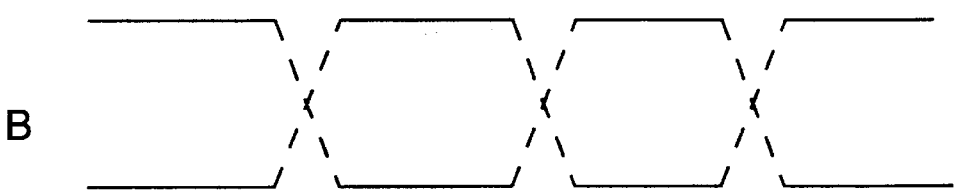

In accordance with aspects of the present invention, variable edge rate driver circuits 40P and 50N are included in the chip 30. The driver circuit 40P is shown in FIG. 3 and its operation is discussed in connection with FIGS. 3 and 4. The driver chip 30 also includes combinational logic blocks 50P and 40N. These logic blocks have signal delays which match the fast path through the variable edge rate blocks 40P and 50N. These blocks 50P and 40N alternatively can be constructed as variable edge rate blocks identical to blocks 40P and 50N. The chip 30 also includes improved switched FET current sources 60P and 60N which reduce pull-up turn-on transients in accordance with principles of the present invention. Current sinks 70P and 70N are also provided to sink the current sourced by switched sources 60P and 60N, respectively. The current source 60P is shown in FIG. 7, and its operation is contrasted with prior circuits and methods shown in FIGS. 5 and 6 and discussed in connection therewith.

Turning now to FIG. 3, the variable edge rate driver circuit 40P includes a "strong" PFET 302 and a "weak" PFET 304 which have drains connected to the chip power supply rail and which have sources connected together. The gate of the weak PFET 304 is grounded, meaning that this transistor is always enabled. However, the gate of the strong PFET 302 is connected to a "wired-OR" control line 306. When the line 306 is true, a positive control voltage appears on the gate of PFET 302 thereby effectively disconnecting it from bridging weak PFET 304. When the wired-OR control line 306 is false, the transistor 302 is enabled and conducts current in parallel with the weak PFET 304. Current is sourced from the positive rail and PFETs 302, 304 via a NOR gate to a control gate of active pull-up transistor Q7P. The NOR gate comprises PFETs 308 and 310 in series with NFETs 312 and 314 in parallel. The gates of FETs 308 and 314 receive user data from internal data path 35. Gates of FETs 310 and 312 receive a driver enable control signal on line 39. A NOR gate 316 receives BAR data on an internal line 37 and the wired-OR control on the line 306. NOR gate 316 controls the gate of pull-down transistor Q2P. The circuit 5ON is substantially identical to the circuit 40P, except that it drives a pull down transistor instead of a pull up transistor. While the variable edge rate driver circuit is shown within a NOR function, it should be understood that the principles of the present invention also apply equally well to inverters, NAND gates, and other complex logic gate topologies known in the art.

The strong PFET 302 has a much higher current-carrying capacity, approximately 10–30 times the current-carrying capacity of the weak PFET 304. When the strong PFET 302 is turned off, a very slow rise time appears on the output pull-up switch Q7P, leading to the waveform graphed in FIG. 4, graph A. When the strong PFET 302 is enabled, a fast rise time appears on the output pull-up switch Q7P producing the waveform graphed in FIG. 4, graph B. Those skilled in the art will appreciate that the FIG. 3 circuit 40P can be inverted, with transistor polarities reversed thereby to implement slow fall times, rather than slow rise times. A comparable pair of dissimilar NFETs can be inserted into the ground return leg (in series with NFETs 312, 314 and ground), to provide selectable slow and fast rise and fall times. Also, switched multiple FETs may be arranged in parallel, instead of just PFETs 302 and 304, such that multiple speed options may be provided. Turning now to FIGS. 5–7, the improved switched current source 60P is explained. Considering first the prior approaches shown in FIG. 5, a current source is formed by PFETs 61 and 62. Transistor 62 is N times larger than transistor 61, and will source a steady state current approximately equal to N times Iref (passing through transistor 61 connected as a diode). When node C at the gate of pull-up driver transistor Q7 is low (off), a current surge will occur because the voltage at node B rises to the positive rail. Node B is characterized by having a significant parasitic capacitance which stores charge and holds a different voltage than the voltage at the output line 12, node D. When transistor Q7 is turned on by a positive control at node C, the charge stored by the parasitic capacitance at node B is rapidly discharged into the load, line 12, and results in an unwanted current spike graphed in graph A of FIG. 7. This spike adds noise to the transmission line and can corrupt data, particularly in an application requiring an ideal current switch, such as LVD SCSI.

One prior solution is illustrated in FIG. 5 by the inclusion of the components within the dashed line box. These additional components include a second switch NFET 66, a current sink NFET 67 in series with node B, and inverter 68. Switch NFET 66 is controlled by a control voltage at node B (which is the logical complement of the control at node C because of inverter 68). When pull-up driver transistor Q7 is off, switch transistor 66 is on, and current source 62 continues to source its nominal source current through transistor switch 66 and current sink FET 67 to ground. Node B therefore has a voltage level which remains close to the voltage level of node D at the transmission line load. When switch Q7 is turned on, and switch 66 is turned off, there is no significant current surge at the load D. The drawback of this prior approach is that as much power is consumed when Q7 is off as when Q7 is on.

Referring now to FIG. 7, PFET transistor 81 is added between the gate (node A) and drain (node B) of PFET 62. Transistor 81 is made much smaller than transistors 61 and 62, approximately 50 times smaller. The gates of transistor 81 and transistor Q7 are connected together. Since transistor 81 is a PFET and transistor Q7 is an NFET, the transistors will have opposite conduction states, such that when transistor Q7 is on, transistor 81 is off. When transistor Q7 is off, transistor 81 is on, thereby connecting nodes A and B together, thereby enabling transistor 62 to supply Iref in addition to transistor 61. The small current being drawn from transistor 62 through transistor 81 is sufficient to maintain most of the charge on the parasitic capacitance and will prevent node B from rising to the positive rail voltage level. When Q7 is turned on again, there will be a negligible surge of current in the waveform delivered to the load, graphed as graph B in FIG. 6. Since the only current passing through the circuit 60P when the pull-up driver Q7 is off is Iref, the surge current has been reduced without incurring the power penalty of the two-switch approach shown in FIG. 5 and discussed above.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Accordingly, the disclosure and description herein are purely illustrative and are not intended to be in any sense limiting.

What is claimed is:

1. An integrated circuit driver chip for a transmission line carrying a negation bias, the chip for driving a data signal onto the line and including:

an on-board precision current reference source, a pull-up FET and a pull-down FET having a common node connected to the transmission line, a variable switching edge driver connected to drive at least one of the pull-up FET and pull-down FET in accordance with a push-pull fast edge mode and a wired-OR slow edge mode, the variable switching edge driver including two current source FETs, one source FET being selectively connected in parallel with the other source FET in accordance with a mode control signal such that the source FETs in parallel implement the push-pull fast edge mode and the other source FET alone implements the wired-OR slow edge mode, and a switched current source for selectively sourcing current through the pull-up FET to the transmission line in accordance with the data signal and including trickle current switched bypass means for maintaining stored electrical charge on a parasitic capacitance present when the pull-up FET is off.

2. An integrated circuit driver chip for a dual-line differential transmission path, each line carrying a weak bias to maintain a logical condition during path-idle intervals, the chip including:

an on-board precision current reference source, a positive line driver, and a negative line driver, data logic for providing data signals to the positive line driver, and the negative line driver, the data logic driving a pull-up FET and a pull-down FET having a common node connected to the transmission line, a variable switching edge driver connected to drive at least one of the pull-up FET and pull-down FET in accordance with a push-pull fast edge mode and a wired-OR slow edge mode, the variable switching edge driver including two current source FETs, one source FET being larger than, and selectively connected in parallel with, an other source FET in accordance with a mode control signal such that the source FETs in parallel implement the push-pull fast edge mode and the other source FET alone implements the wired-OR slow edge mode, and a switched current source for selectively sourcing current through the pull-up FET to the transmission line in accordance with the data signal and including trickle current switched bypass means for maintaining stored electrical charge on a parasitic capacitance when the pull-up FET is off.

3. The integrated circuit driver chip set forth in claim 2 wherein the one source FET is 10 to 30 times larger than the other source FET.

4. An integrated circuit driver chip for a transmission line, the chip for driving data onto the transmission line and including:

- at least a pull-up NFET driver having a source electrode connected to the transmission line, a drain electrode connected to a current source, and a gate electrode,
- a variable switching edge pre-driver connected to the gate electrode of the pull-up FET, the pre-driver comprising:
- a current source comprising a first PFET and a second PFET, the first PFET having a source connected to a positive power supply, a drain, and a gate connected to a negative bias source relative to the positive supply,
- the second PFET having a source connected to the positive power supply, a drain connected to the drain of the first PFET to form a common node, and a gate connected to a control line providing a dual-mode control wherein a negative logic level causes the second PFET to conduct and implement a push-pull fast edge mode and a positive logic level places the second PFET into a high impedance off state and implements a wired-OR slow edge mode, and
- a NOR gate having an input connected to a source of the data within the chip and an output connected to the gate electrode of the pull-up NFET driver, the NOR gate being connected between the common node and a chip ground.

5. The integrated circuit driver chip set forth in claim 4 wherein the NOR gate comprises a third PFET and a first NFET, the third PFET having a source connected to the common node, a drain connected to a path including the gate electrode of the pull-up NFET, and a gate connected to the source of the data, and the first NFET having a source grounded, a drain connected to the path and a gate connected to the source of the data.

6. The integrated circuit driver chip set forth in claim 5 further comprising a fourth PFET in series in the path between the third PFET and the first NFET and the gate electrode of the pull-up NFET and a second NFET in parallel with the first NFET, the fourth PFET and the second NFET having gates connected in common to a logical pre-driver enable control signal.

7. The integrated circuit driver chip set forth in claim 6 wherein the transmission line includes a weak bias current supply for biasing the transmission line to a known logical state in absence of driving signals from the driver chip or another driver, and wherein the second PFET has a much higher current carrying capacity than the first PFET transistor.

8. The integrated circuit driver chip set forth in claim 7 wherein the second PFET is approximately ten to thirty times larger than the first PFET.

9. An integrated circuit driver chip for a transmission line, the chip for driving data onto the transmission line and including:

- a pull-up NFET driver and a pull-down NFET driver having gate electrodes connected to data and data-complement respectively, and having a common node connected to the transmission line,
- a switched current source for selectively sourcing current through at least one of the pull-up NFET driver and the pull-down NFET driver to the transmission line in accordance with the data signal, and including
- a reference current flow path,
- a first PFET having a source connected to a positive power supply of the driver chip, a drain electrode connected to a drain electrode of one of said pull-up NFET driver and said pull-down NFET driver, and a gate electrode connected to said reference current path, and
- a second PFET having a source electrode connected to said drain electrode of said first PFET, a drain electrode connected to said reference current flow path, and a gate electrode connected to receive one of data and data-complement.

* * * * *